(12) United States Patent
Herr et al.

(10) Patent No.: US 9,174,840 B2
(45) Date of Patent: Nov. 3, 2015

(54) JOSEPHSON AC/DC CONVERTER SYSTEMS AND METHOD

(71) Applicants: Quentin P. Herr, Ellicott City, MD (US); Anna Y. Herr, Ellicott City, MD (US)

(72) Inventors: Quentin P. Herr, Ellicott City, MD (US); Anna Y. Herr, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 108 days.

(21) Appl. No.: 14/044,220

(22) Filed: Oct. 2, 2013

(65) Prior Publication Data

US 2015/0092465 A1 Apr. 2, 2015

(51) Int. Cl.
*H02M 1/32* (2007.01)
*B82Y 10/00* (2011.01)
*H03K 17/92* (2006.01)
*H03K 19/00* (2006.01)
*H03K 19/195* (2006.01)
*G06N 99/00* (2010.01)

(52) U.S. Cl.
CPC ............... *B82Y 10/00* (2013.01); *H03K 17/92* (2013.01); *H03K 19/0008* (2013.01); *H03K 19/195* (2013.01); *H03K 19/1952* (2013.01); *H03K 19/1954* (2013.01); *G06N 99/002* (2013.01); *H03K 2217/0036* (2013.01)

(58) Field of Classification Search
CPC ... H03K 17/693; H03K 17/92; H03K 17/063; H03K 3/38; H03K 19/1952; H02M 1/32
USPC ........... 363/123, 125, 126; 327/365, 367, 528
See application file for complete search history.

(56) References Cited

U.S. PATENT DOCUMENTS

| | | | |
|---|---|---|---|
| 4,621,203 A | 11/1986 | Sweeny | |
| 5,114,912 A | 5/1992 | Benz | |
| 6,348,699 B1 | 2/2002 | Zehe | |
| 6,756,925 B1 * | 6/2004 | Leung et al. | 341/133 |
| 6,833,693 B2 | 12/2004 | Andrews | |
| 2003/0016069 A1 * | 1/2003 | Furuta et al. | 327/367 |
| 2003/0058026 A1 * | 3/2003 | Johnson | 327/367 |
| 2006/0290553 A1 * | 12/2006 | Furuta et al. | 341/155 |
| 2007/0052441 A1 * | 3/2007 | Taguchi et al. | 326/3 |
| 2008/0129368 A1 * | 6/2008 | Furuta et al. | 327/367 |
| 2009/0082209 A1 * | 3/2009 | Bunyk et al. | 505/190 |
| 2010/0033206 A1 * | 2/2010 | Herr et al. | 326/4 |
| 2010/0033252 A1 * | 2/2010 | Herr et al. | 330/286 |
| 2013/0040818 A1 * | 2/2013 | Herr et al. | 505/190 |

FOREIGN PATENT DOCUMENTS

JP 09198876 A 7/1997

* cited by examiner

*Primary Examiner* — Adolf Berhane
(74) *Attorney, Agent, or Firm* — Tarolli, Sundheim, Covell & Tummino LLP

(57) ABSTRACT

One embodiment describes an AC/DC converter system. The system includes a flux-shuttle loop that is inductively coupled with an AC input signal. The system also includes a plurality of Josephson junctions spaced about the flux shuttle loop that are configured to sequentially trigger in response to the AC input signal and to provide a single-flux quantum (SFQ) pulse that moves sequentially around the flux-shuttle loop that results in a DC output signal being provided through an output inductor.

20 Claims, 3 Drawing Sheets

US 9,174,840 B2

JOSEPHSON AC/DC CONVERTER SYSTEMS AND METHOD

TECHNICAL FIELD

The present invention relates generally to quantum and classical digital superconducting circuits, and specifically to a Josephson AC/DC converter systems and method.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux superconducting circuitry, utilizing superconducting Josephson junctions, and can exhibit typical signal power of around 4 nW (nanowatts) at a typical data rate of 20 Gb/s (gigabytes/second) or greater, and can operate at temperatures of around 4° Kelvin. The Josephson junction is an active device that is supplied with a DC bias current, and the power budget in such circuits is dominated by static power consumption which happens whether or not the active device is switching. Typical systems can provide the DC bias current directly using a bias resistor network, which can result in substantially high currents (equal to or greater than an amp), which can result in spurious magnetic fields and heat resulting from high power dissipation.

SUMMARY

One embodiment describes an AC/DC converter system. The system includes a flux-shuttle loop that is inductively coupled with an AC input signal. The system also includes a plurality of Josephson junctions spaced about the flux shuttle loop that are configured to sequentially trigger in response to the AC input signal and to provide a single-flux quantum (SFQ) pulse that moves sequentially around the flux-shuttle loop that results in a DC output signal being provided through an output inductor.

Another embodiment includes a method for providing a DC output signal based on an AC input signal. The method includes providing an initialization bias current to a flux-shuttle loop comprising a plurality of stages. The method also includes providing the AC input signal that is inductively coupled with each of the plurality of stages. The method further includes sequentially triggering a Josephson junction associated with each of the plurality of stages based on a frequency of the AC input signal to circulate a single-flux quantum around the flux-shuttle loop to generate the DC output signal through an output inductor.

Another embodiment includes an AC/DC converter system. The system includes a flux-shuttle loop comprising a plurality of stages and being configured to receive an AC input signal. Each of the plurality of stages includes a transformer configured to generate a bias current based on inductive coupling of the AC input signal to the respective one of the plurality of stages. Each of the plurality of stages also includes a Josephson junction configured to trigger to provide a single-flux quantum in response to the bias current. Each of the plurality of stages also includes an inductor interconnecting the respective one of the plurality of stages with the output inductor and being configured to provide a current pulse in response to the single-flux quantum. The system also includes an output inductor coupled to each of the storage inductors and being configured to provide the DC output signal based on the received current pulse outputs that are sequentially provided from each of the storage inductors.

DETAILED DESCRIPTION

The present invention relates generally to quantum and classical digital superconducting circuits, and specifically to a Josephson AC/DC converter systems and method. The Josephson AC/DC converter includes a flux-shuttle loop comprising a plurality of stages. Each of the plurality of stages comprises a transformer, at least one Josephson junction, and an inductor. The transformer is configured to inductively couple an AC input signal to the flux-shuttle loop, such that the AC input signal provides a bias current in the flux-shuttle loop. The flux-shuttle loop also includes an initialization transformer configured to generate a bias current in response to a DC initialization signal. Thus, in response to the bias current provided via the initialization transformer and the bias current provided by the AC input signal via the transformers in each of the stages, the Josephson junction(s) in each of the stages triggers to provide a single-flux quantum (SFQ) pulse around the flux-shuttle loop based on the frequency of the AC input signal. As an example, the SFQ pulse can propagate through a given stage at each positive and negative cycle of the AC input signal. The SFQ pulse is provided to the inductor of each of the plurality of stages to provide a current pulse to an output inductor, such that the output inductor provides a DC output signal.

As an example, the AC input signal can include an in-phase AC input signal and a quadrature-phase AC input signal, and the flux-shuttle loop can include four stages. A primary winding of the transformers of two of the stages can have an opposite polarity relative to a primary winding of the transformers of the other two of the stages. Therefore, on a positive cycle of each of the in-phase AC input signal and the quadrature-phase AC input signal, the bias current induced in secondary windings of the transformers in two of the stages can be provided in a given direction around the flux-shuttle loop, and on a negative cycle of each of the in-phase AC input signal and the quadrature-phase AC input signal, the bias current induced in secondary windings of the transformers in the other two of the stages can be provided in the same given direction around the flux-shuttle loop. Therefore, the Josephson junction(s) in each of the stages can sequentially trigger at each 90° of the AC input signal to rotate the SFQ pulse around the flux-shuttle loop to provide current pulses to the output inductor to generate the DC output voltage.

Figure 1:
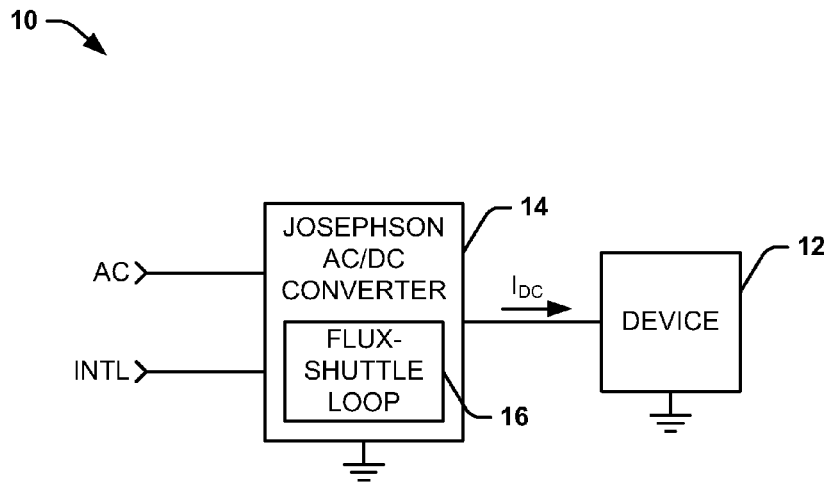
FIG. 1 illustrates an example of a superconducting circuit system.

FIG. 1 illustrates an example of a superconducting circuit system 10. As an example, the superconducting circuit system 10 can be implemented in any of a variety of quantum computing applications, such as quantum memory or processing systems. The superconducting circuit system 10 includes a device 12 that receives a DC signal, demonstrated in the example of FIG. 1 as a DC current $I_{DC}$. As an example, the DC signal $I_{DC}$ can be provided as a power signal or as a driver signal to drive the device 12. For example, the device 12 can correspond to a memory driver, such as to provide a read current or a write current to a memory cell.

The superconducting circuit system 10 also includes a Josephson AC/DC converter 14 that is configured to convert an AC input signal AC to the DC signal $I_{DC}$. As an example, the AC input signal AC can be a sinusoidal waveform having a substantially constant frequency (e.g., approximately 10 GHz) and a low AC current magnitude, such as applicable to reciprocal quantum logic (RQL) superconducting circuits (e.g., approximately 2 mA RMS). The Josephson AC/DC converter 14 is demonstrated as receiving an initialization signal INTL that can be provided to the Josephson AC/DC converter 14 to initialize the operation of the Josephson AC/DC converter 14 to convert the AC input signal AC to the DC signal $I_{DC}$. As an example, the initialization signal INTL can be a DC signal that is substantially continuously provided to the Josephson AC/DC converter 14 to maintain the AC/DC conversion operation of the Josephson AC/DC converter 14. For example, the initialization signal INTL can induce a bias current.

In the example of FIG. 1, the Josephson AC/DC converter 14 includes a flux-shuttle loop 16. The flux-shuttle loop 16 can include a plurality of stages that are configured to transfer a single-flux quantum (SFQ) pulse around the flux-shuttle loop 16 during the AC/DC conversion operation of the Josephson AC/DC converter 14 based on the frequency of the AC input signal AC. As described herein, the term "loop" with respect to the flux-shuttle loop 16 describes a substantially continuous loop (e.g., circular) arrangement of the stages of the flux-shuttle loop 16, such that a first stage can be coupled to a last stage. Therefore, the SFQ pulse can substantially continuously propagate around the flux-shuttle loop 16 while the initialization signal INTL is provided.

The flux-shuttle loop 16 can be arranged without resistors. As an example, each of the stages of the flux-shuttle loop 16 can include a transformer, at least one Josephson junction, and an inductor. The transformer can be configured to inductively couple the AC input signal AC to the flux-shuttle loop 16, such that the AC input signal AC provides a bias current in the flux-shuttle loop 16. The bias current induced by the AC input signal AC via the transformer can be added to the bias current generated via the initialization signal INTL. Thus, in response to the collective bias currents, the Josephson junction(s) in each of the stages of the flux-shuttle loop 16 triggers to generate the SFQ pulse that propagates around the flux-shuttle loop 16 based on the frequency of the AC input signal AC. As an example, the SFQ pulse can propagate through a given one of the stages at each positive and negative cycle of the AC input signal AC. The SFQ pulse, as it propagates around the flux-shuttle loop 16, can be provided to the inductor of each of the stages of the flux-shuttle loop 16 to provide a current pulse, such as to an output inductor in the Josephson AC/DC converter 14 (not shown). Therefore, the DC signal $I_{DC}$ can flow through the output inductor based on the current pulses being sequentially provided to the output inductor based on the frequency of the AC input signal AC. For example, the current pulses can be generated based on the SFQ pulses providing a small voltage (e.g., approximately 2 μV/GHz) to each of the inductors, such that the resulting current pulses can be integrated in the output inductor to provide the DC signal $I_{DC}$.

The Josephson AC/DC converter 14 can therefore operate to convert the AC input signal AC to the DC signal $I_{DC}$ in a power efficient manner. As described previously, the Josephson AC/DC converter 14 can be implemented without resistors. Therefore, the Josephson AC/DC converter 14 only dissipates power via the current pulses to provide the DC signal $I_{DC}$ to the device 12, such that no additional power is dissipated to maintain the SFQ pulse propagating around the flux-shuttle loop 16. In addition, the Josephson AC/DC converter 14 can generate substantially no heat from static power dissipation, as opposed to typical resistance-based DC power sources. Accordingly, the Josephson AC/DC converter 14 can operate more efficiently and effectively than typical AC/DC converters, particularly in a quantum computing environment. For example, upon the DC output signal $I_{DC}$ achieving an approximately maximum amplitude, the initialization signal INTL can be deactivated. As a result, the Josephson junction(s) in each of the stages of the flux-shuttle loop 16 no longer sequentially trigger, but the DC output current IDC maintains the amplitude without dissipation so long as the load is quiescent (e.g., superconducting).

Figure 2:
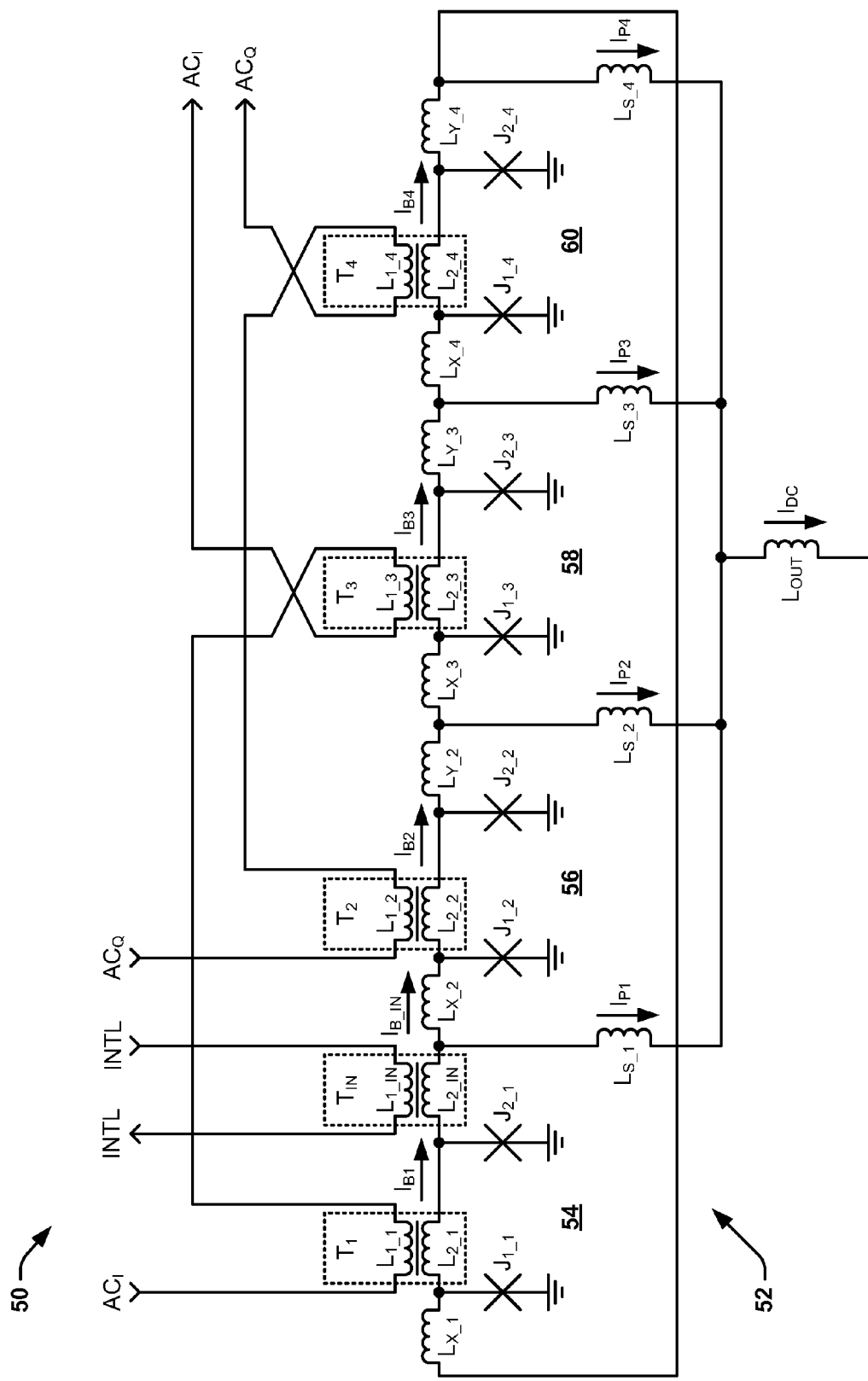
FIG. 2 illustrates an example of a Josephson AC/DC converter.

FIG. 2 illustrates an example of a Josephson AC/DC converter 50. The Josephson AC/DC converter 50 can correspond to Josephson AC/DC converter 14 in the superconducting circuit system 10. Therefore, the Josephson AC/DC converter 50 includes a flux-shuttle loop 52 that includes a plurality of stages, demonstrated in the example of FIG. 2 as a first stage 54, a second stage 56, a third stage 58, and a fourth stage 60. The stages 54, 56, 58, and 60 are sequentially coupled to form a loop arrangement. The Josephson AC/DC converter 50 is configured to convert an AC input signal to a DC output signal. In the example of FIG. 2, the AC input signal is demonstrated as including an in-phase AC input signal $AC_I$ and a quadrature-phase AC input signal $AC_Q$. As an example, the in-phase AC input signal $AC_I$ and the quadrature-phase AC input signal $AC_Q$ can collectively correspond to AC quadrature signals that are implemented for RQL in quantum computing circuits. The DC output signal is demonstrated as a current $I_{DC}$ that flows through an output inductor $L_{OUT}$.

Each of the stages 54, 56, 58, and 60 are configured substantially similarly with respect to each other. The first stage 54 includes a transformer $T_1$, a first Josephson junction $J_{1\_1}$, a second Josephson junction $J_{2\_1}$, and a first inductor $L_{X\_1}$. The second stage 56 includes a transformer $T_2$, a first Josephson junction $J_{1\_2}$, a second Josephson junction $J_{2\_2}$, a first inductor $L_{X\_2}$, and a second inductor $L_{Y\_2}$. The third stage 58 includes a transformer $T_3$, a first Josephson junction $J_{1\_3}$, a second Josephson junction $J_{2\_3}$, a first inductor $L_{X\_3}$, and a second inductor $L_{Y\_3}$. The fourth stage 60 includes a transformer $T_4$, a first Josephson junction $J_{1\_4}$, a second Josephson junction $J_{2\_4}$, a first inductor $L_{X\_4}$, and a second inductor $L_{Y\_4}$.

The transformers $T_1$ and $T_3$ include a primary winding $L_{1\_1}$ and $L_{1\_3}$, respectively, through which the in-phase AC input signal $AC_I$ flows, and the transformers $T_2$ and $T_4$ include a primary winding $L_{1\_2}$ and $L_{1\_4}$, respectively, through which the quadrature-phase AC input signal $AC_Q$ flows. The transformers $T_1$ and $T_3$ provide inductive coupling of the in-phase AC input signal $AC_I$ to the flux-shuttle loop 52, and the transformers $T_2$ and $T_4$ provide inductive coupling of the quadrature-phase AC input signal $AC_Q$ to the flux-shuttle loop 52. Therefore, the first transformer $T_1$ can generate a bias current $I_{B1}$ via a secondary winding $L_{2\_1}$ and the third transformer $T_3$ can generate a bias current $I_{B3}$ via a secondary winding $L_{2\_3}$ in response to the in-phase AC input signal $AC_I$. Similarly, the second transformer $T_2$ can generate a bias current $I_{B2}$ via a secondary winding $L_{2\_2}$ and the fourth transformer $T_4$ can generate a bias current $I_{B4}$ via a secondary winding $L_{2\_4}$ in response to the quadrature-phase AC input signal $AC_Q$.

As an example, each of the first in-phase AC input signal $AC_I$ and the quadrature-phase AC input signal $AC_Q$ can include a positive portion (e.g., in a first half of a respective period) and a negative portion (e.g., in a second half of a respective period). As demonstrated in the example of FIG. 2, the primary winding $L_{1\_3}$ of the third transformer $T_3$ has a polarity that is opposite the polarity of the primary winding $L_{1\_1}$ of the first transformer $T_1$. Similarly, the primary winding $L_{1\_4}$ of the fourth transformer $T_4$ has a polarity that is opposite the polarity of the primary winding $L_{1\_2}$ of the second transformer $T_2$. Therefore, the bias current $I_{B1}$ is induced in a first direction via the second winding $L_{2\_1}$ of the first transformer $T_1$ during the negative portion of the in-phase AC input signal $AC_I$. However, because the primary windings $L_{1\_1}$ and $L3\_1$ of the first and third transformers $T_1$ and $T_3$, respectively, have opposite polarities, the bias current $I_{B3}$ is also induced in the first direction via the second winding $L_{2\_3}$ of the third transformer $T_3$ during the positive portion of the in-phase AC input signal $AC_I$. Similarly, the bias current $I_{B2}$ is induced in the first direction during the negative portion of the quadrature-phase AC input signal $AC_Q$, and the bias current $I_{B4}$ is also induced in the first direction during the positive portion of the quadrature-phase AC input signal $AC_Q$. Therefore, as described in greater detail in the example of FIG. 3, the bias currents $I_{B1}$, $I_{B2}$, $I_{B3}$, and $I_{B4}$ are sequentially provided in each of 90° intervals of the AC input signals $AC_I$ and $AC_Q$. In the example of FIG. 2, the "first direction" is demonstrated as being in a same current direction as an initialization bias current $I_{B\_IN}$, as described herein, and which is demonstrated as from left-to-right from the respective secondary windings $L_{2\_1}$, $L_{2\_2}$, $L_{2\_3}$, and $L_{2\_4}$.

The Josephson AC/DC converter 50 includes an initialization transformer $T_{IN}$ that forms part of the first stage 54, demonstrated in the example of FIG. 2 as replacing a second inductor (e.g., $L_{Y\_1}$). The Josephson AC/DC converter 50 is demonstrated as receiving an initialization signal INTL that can be provided to the Josephson AC/DC converter 50 to initialize the operation of the Josephson AC/DC converter 50. As an example, the initialization signal INTL can be a DC signal that is substantially continuously provided to the Josephson AC/DC converter 50. In the example of FIG. 2, the initialization signal INTL is provided through the primary winding $L_{1\_IN}$ of the transformer $T_{IN}$, which induces the initialization bias current $I_{B\_IN}$ to be provided from the secondary winding $L_{2\_IN}$. In the example of FIG. 2, the initialization bias current $I_{B\_IN}$ is demonstrated as flowing through the first inductor $L_{X\_2}$.

The addition of the magnitude of the initialization bias current $I_{B\_IN}$ and the bias current $I_{B2}$ can be sufficient to exceed a critical current of the Josephson junction $J_{1\_2}$. For example, during a negative portion of the quadrature-phase AC input signal $AC_Q$, the bias current $I_{B2}$ and the initialization bias current $I_{B\_IN}$ can combine to flow through the Josephson junction $J_{2\_2}$. In response, because the magnitude of the bias currents $I_{B2}$ and $I_{B\_IN}$ exceed the critical current of the Josephson junction $J_{2\_2}$, the Josephson junction $J_{2\_2}$ triggers to generate a single-flux quantum (SFQ) pulse, which can be exhibited in the flux-shuttle loop 52 as a voltage pulse. The SFQ pulse can then propagate from the second stage 56 to the third stage 58 through the inductors $L_{Y\_1}$ and $L_{X\_2}$ to trigger the first Josephson junction $J_{1\_3}$. During the positive portion of the in-phase AC input signal $AC_I$, the SFQ pulse can combine with the bias current $I_{B3}$ to trigger the Josephson junction $J_{2\_3}$. As a result, the Josephson junction $J_{2\_3}$ generates the SFQ pulse. The Josephson junctions $J_1$ and $J_2$ can thus continue to sequentially trigger based on the frequency of the in-phase AC input signal $AC_I$ and the quadrature-phase AC input signal $AC_Q$. Accordingly, the SFQ pulse is sequentially generated in each of the stages 54, 56, 68, and 60 at each 90° interval of the AC input signals $AC_I$ and $AC_Q$.

In response to the SFQ pulse sequentially generated by the Josephson junction $J_2$ in each of the stages 54, 56, 58, and 60, a current pulse is generated in a storage inductor associated with the respective one of the stages 54, 56, 58, and 60. In the example of FIG. 2, the first stage 54 includes a storage inductor $L_{S\_1}$, the second stage 56 includes a storage inductor $L_{S\_2}$, the third stage 58 includes a storage inductor $L_{S\_3}$, and the fourth stage 60 includes a storage inductor $L_{S\_4}$. Thus, in response to the Josephson junction $J_{2\_1}$ triggering, the SFQ pulse generates a resulting current pulse $I_{P1}$ in the storage inductor $L_{S\_1}$. In response to the Josephson junction $J_{2\_2}$ triggering, the SFQ pulse generates a resulting current pulse $I_{P2}$ in the storage inductor $L_{S\_2}$. In response to the Josephson junction $J_{2\_3}$ triggering, the SFQ pulse generates a resulting current pulse $I_{P3}$ in the storage inductor $L_{S\_3}$. In response to the Josephson junction $J_{2\_4}$ triggering, the SFQ pulse generates a resulting current pulse $I_{P4}$ in the storage inductor $L_{S\_4}$. Each of the storage inductors $L_{S\_1}$, $L_{S\_2}$, $L_{S\_3}$, and $L_{S\_4}$ are coupled to the output inductor $L_{OUT}$. As a result, the output inductor $L_{OUT}$ integrates each of the current pulses $I_{P1}$, $I_{P2}$, $I_{P3}$, and $I_{P4}$ to provide the DC output signal $I_{DC}$, such that the Josephson AC/DC converter 50 acts as a current-limited DC signal source based on current limitation of the output inductor $L_{OUT}$. As a result, the DC output signal $I_{DC}$ can be provided as a DC signal converted from the in-phase AC input signal $AC_I$ and the quadrature-phase AC input signal $AC_Q$ to a device (e.g., the device 12 in the example of FIG. 1).

Figure 3:
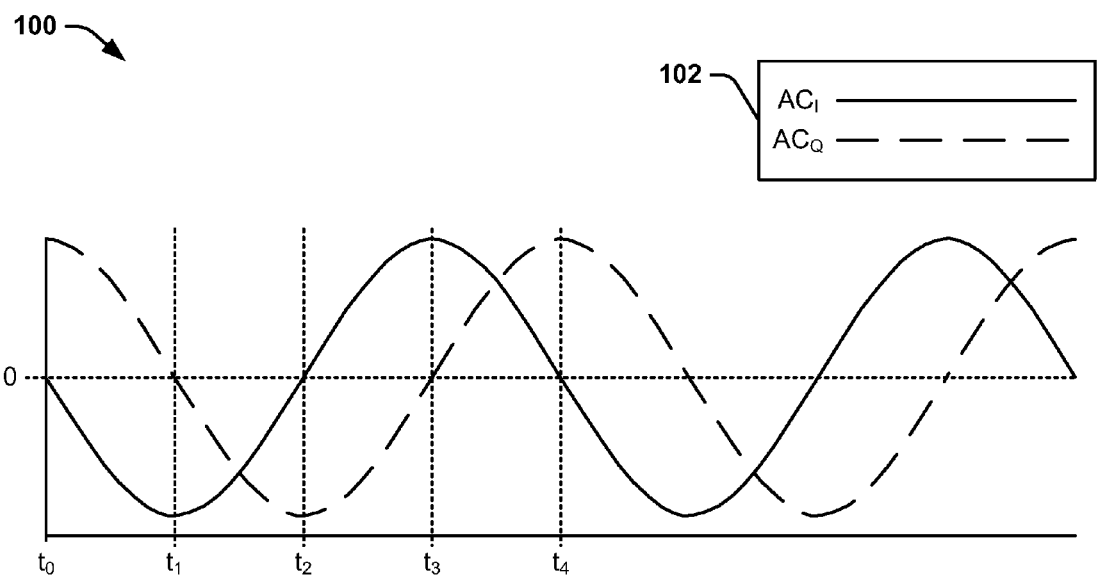
FIG. 3 illustrates an example of a timing diagram.

FIG. 3 illustrates an example of a timing diagram 100. The timing diagram 100 includes the in-phase AC input signal $AC_I$ and the quadrature-phase AC input signal $AC_Q$, as indicated at the legend 102, as a function of time. The in-phase AC input signal $AC_I$ and the quadrature-phase AC input signal $AC_Q$ are each demonstrated as sinusoidal signals having magnitudes centered about zero. The in-phase AC input signal $AC_I$ and the quadrature-phase AC input signal $AC_Q$ in the example of FIG. 3 can correspond to the in-phase AC input signal $AC_I$ and the quadrature-phase AC input signal $AC_Q$ in the example of FIG. 2. Therefore, reference is to be made to the example of FIG. 2 in the following description of the example of FIG. 3.

At a time $t_0$, a negative portion of the in-phase AC input signal $AC_I$ begins, with a positive peak of the in-phase AC input signal $AC_I$ occurring at a time $t_1$. Therefore, the in-phase AC input signal $AC_I$ begins to induce the bias current $I_{B1}$ via the secondary winding $L_{2\_1}$ in the first direction based on the inductive coupling with the primary winding $L_{1\_1}$. At a time just subsequent to the time $t_1$ (e.g., based on the inductance of the transformer $T_1$), the magnitude of the bias current $I_{B1}$, combined with the SFQ pulse provided by the Josephson junction $J_{1\_1}$, exceeds the critical current of the Josephson junction $J_{2\_1}$ having previously triggered, and therefore becomes sufficient to trigger the Josephson junction $J_{2\_1}$. As a result, the Josephson junction $J_{2\_1}$ generates the SFQ pulse, which generates the current pulse $I_{P1}$ in the storage inductor $L_{S\_1}$ that is integrated by the output inductor $L_{OUT}$ and propagates to the second stage to trigger the Josephson junction $J_{1\_2}$.

Also, at the time $t_1$, a negative portion of the quadrature-phase AC input signal $AC_Q$ begins, with a positive peak of the quadrature-phase AC input signal $AC_Q$ occurring at a time $t_2$. Therefore, the quadrature-phase AC input signal $AC_Q$ begins to induce the bias current $I_{B2}$ via the secondary winding $L_{2\_2}$ in the first direction based on the inductive coupling with the primary winding $L_{1\_2}$. At a time just subsequent to the time $t_2$ (e.g., based on the inductance of the transformer $T_2$), the magnitude of the bias current $I_{B2}$, combined with the SFQ pulse provided by the Josephson junction $J_{1\_2}$ (and/or the initialization bias current $I_{B\_IN}$) exceeds the critical current of the Josephson junction $J_{2\_2}$, and therefore becomes sufficient to trigger the Josephson junction $J_{2\_2}$. As a result, the Josephson junction $J_{2\_2}$ generates the SFQ pulse, which generates the current pulse $I_{P2}$ in the storage inductor $L_{S\_2}$ that is integrated by the output inductor $L_{OUT}$ and propagates to the third stage to trigger the Josephson junction $J_{1\_3}$.

Also, at the time $t_2$, a positive portion of the in-phase AC input signal $AC_I$ begins, with a negative peak of the in-phase AC input signal $AC_I$ occurring at a time $t_3$. Therefore, the in-phase AC input signal $AC_I$ begins to induce the bias current $I_{B3}$ via the secondary winding $L_{2\_3}$ in the first direction based on the inductive coupling with the primary winding $L_{1\_3}$ (e.g., opposite the polarity of the primary winding $L_{1\_1}$). At a time just subsequent to the time $t_3$ (e.g., based on the inductance of the transformer $T_3$), the magnitude of the bias current $I_{B3}$, combined with the SFQ pulse provided by the Josephson junction $J_{1\_3}$, exceeds the critical current of the Josephson junction $J_{2\_3}$, and therefore becomes sufficient to trigger the Josephson junction $J_{2\_3}$. As a result, the Josephson junction $J_{2\_3}$ generates the SFQ pulse, which generates the current pulse $I_{P3}$ in the storage inductor $L_{S\_3}$ that is integrated by the output inductor $L_{OUT}$ and propagates to the fourth stage to trigger the Josephson junction $J_{1\_4}$.

Also, at the time $t_3$, a positive portion of the quadrature-phase AC input signal $AC_Q$ begins, with a negative peak of the quadrature-phase AC input signal $AC_Q$ occurring at a time $t_4$. Therefore, the quadrature-phase AC input signal $AC_Q$ begins to induce the bias current $I_{B4}$ via the secondary winding $L_{2\_4}$ in the first direction based on the inductive coupling with the primary winding $L_{1\_4}$ (e.g., opposite the polarity of the primary winding $L_{1\_2}$). At a time just subsequent to the time $t_4$ (e.g., based on the inductance of the transformer $T_4$), the magnitude of the bias current $I_{B4}$, combined with the SFQ pulse provided by the Josephson junction $J_{1\_4}$, exceeds the critical current of the Josephson junction $J_{2\_4}$, and therefore becomes sufficient to trigger the Josephson junction $J_{2\_4}$. As a result, the Josephson junction $J_{2\_4}$ generates the SFQ pulse, which generates the current pulse $I_{P4}$ in the storage inductor $L_{S\_4}$ that is integrated by the output inductor $L_{OUT}$ and propagates to the first stage to trigger the Josephson junction $J_{1\_1}$.

Also, at the time $t_4$, a negative portion of the in-phase AC input signal $AC_I$ begins. Therefore, the process of converting the in-phase AC input signal $AC_I$ and the quadrature-phase AC input signal $AC_Q$ repeats, such that the time $t_4$ is equivalent to the time $t_0$, as described previously. Accordingly, the Josephson junctions $J_{1\_1}, J_{2\_1}, J_{1\_2}, J_{2\_2}, J_{1\_3}, J_{2\_3}, J_{1\_4}$, and $J_{2\_4}$ can sequentially trigger to propagate the SFQ pulse around the flux-shuttle loop 52 to continuously provide the current pulses $I_{P1}, I_{P2}, I_{P3}$, and $I_{P4}$ in response to the triggering of the $J_{2\_1}, J_{2\_2}, J_{2\_3}$, and $J_{2\_4}$, respectively, to the output inductor $L_{OUT}$ based on the frequency of the in-phase AC input signal $AC_I$ and the quadrature-phase AC input signal $AC_Q$. As a result, the output inductor $L_{OUT}$ can integrate the current pulses $I_{P1}, I_{P2}, I_{P3}$, and $I_{P4}$ to provide the DC output signal $I_{DC}$.

It is to be understood that the Josephson AC/DC converter 50 is not intended to be limited to the example of FIG. 2. As an example, the AC input signal is not limited to being implemented as the in-phase AC input signal $AC_I$ and the quadrature-phase AC input signal $AC_Q$, but could instead be a single sinusoidal signal. As another example, the flux-shuttle loop 52 could include more or less than the four stages 54, 56, 58, and 60, such as any multiple of two stages to accommodate positive and negative portions of the AC input signal. Additionally, while the example of FIG. 2 demonstrates the in-phase and quadrature-phase AC input signals $AC_I$ and $AC_Q$ provided in opposite respective polarities to sequentially provide the bias currents $I_{B1}, I_{B2}, I_{B3}$, and $I_{B4}$ at each of 90° intervals, other arrangements of AC input signals can be implemented to provide the bias currents $I_{B1}, I_{B2}, I_{B3}$, and $I_{B4}$ at each of 90° intervals. For example, the Josephson AC/DC converter 50 can implement four separate AC input signals that are each 90° out of phase of each other, with the transformers $T_1$ through $T_4$ all having the same polarity. Furthermore, other types of AC signals can be implemented for providing the DC output signal $I_{DC}$, such as square wave signals and/or signals having separate frequencies with respect to each other. As yet another example, the stages 54, 56, 58, and 60 are not limited to the arrangement provided in the example of FIG. 2, but could instead have a different physical arrangement with respect to the Josephson junctions $J_1$ and $J_2$, inductors $L_X$ and $L_Y$, transformers $T_1$ through $T_4$, and/or storage inductors $L_S$. Accordingly, the Josephson AC/DC converter 50 can be configured in a variety of ways.

As demonstrated in the example of FIG. 2, the in-phase AC input signal $AC_I$ and the quadrature-phase AC input signal $AC_Q$ are demonstrated as passing through the primary windings $L_{1\_1}, L_{1\_2}, L_{1\_3}$, and $L_{1\_4}$ of the transformers $T_1, T_2, T_3$, and $T_4$, respectively. However, the in-phase AC input signal $AC_I$ and the quadrature-phase AC input signal $AC_Q$ can, for example, be provided for a plurality of Josephson AC/DC converters, such as to provide AC/DC conversion for a plurality of devices.

Figure 4:
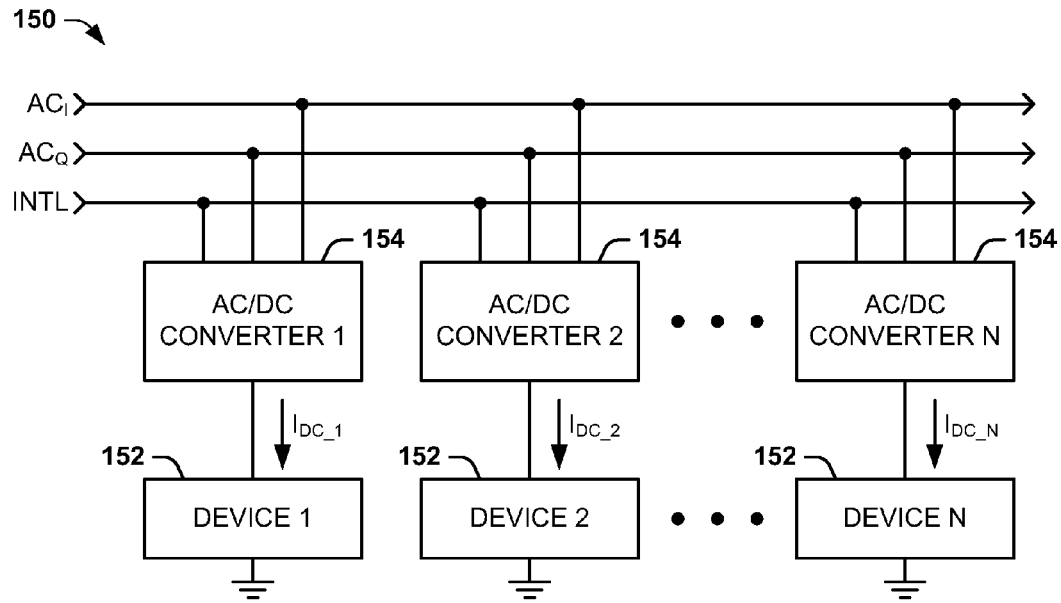
FIG. 4 illustrates an example of a superconducting circuit system.

FIG. 4 illustrates an example of a superconducting circuit system 150. As an example, the superconducting circuit system 150 can be implemented in any of a variety of quantum computing applications, such as quantum memory or processing systems. The superconducting circuit system 150 includes a plurality N of devices 152, where N is a positive integer. Each of the devices 152 receive a respective DC signal, demonstrated in the example of FIG. 4 as respective DC currents $I_{DC\_1}$ through $I_{DC\_N}$. As an example, the DC signals $I_{DC\_1}$ through $I_{DC\_N}$ can be provided as power signals or as driver signals to drive the devices 152. For example, the devices 152 can each correspond to respective memory drivers, such as to provide read and write currents to an array of memory cells.

The superconducting circuit system 150 also includes a respective plurality of Josephson AC/DC converters 154 that are configured to convert an AC input signal to the DC signals $I_{DC\_1}$ through $I_{DC\_N}$. In the example of FIG. 4, the AC input signal is demonstrated as an in-phase AC input signal $AC_I$ and a quadrature-phase AC input signal $AC_Q$, such as demonstrated in the examples of FIGS. 2 and 3. As an example, each of the Josephson AC/DC converters 154 can be configured substantially similar to the Josephson AC/DC converter 50 in the example of FIG. 2. Therefore, the Josephson AC/DC converters 154 can each include a flux-shuttle loop comprising four stages that are each configured substantially the same to propagate an SFQ pulse around the loop to generate current pulses that are integrated into the respective DC output signals $I_{DC\_1}$ through $I_{DC\_N}$ via respective output inductors. The Josephson AC/DC converters 154 are also demonstrated as receiving an initialization signal INTL that can be provided to the Josephson AC/DC converter 154 to initialize the operation of the Josephson AC/DC converters 154 to convert the in-phase AC input signal $AC_I$ and the quadrature-phase AC input signal $AC_Q$ to the DC signals $I_{DC\_1}$ through $I_{DC\_N}$. In the example of FIG. 4, the same initialization signal INTL is provided to each of the Josephson AC/DC converters 154, such that all of the Josephson AC/DC converters 154 operate together to generate the DC output signals IDC1 through $I_{DC\_N}$. However, it is to be understood that each of the Josephson AC/DC converters 154 can be provided separate initialization signals INTL, such that the Josephson AC/DC converters 154 can be independently controlled to provide combinations of the DC output signals $I_{DC\_1}$ through $I_{DC\_N}$. Additionally, while the Josephson AC/DC converters 154 are arranged in parallel in the example of FIG. 4, it is to be understood that the Josephson AC/DC converters 154 can instead be arranged in series, such as to collectively generate a single DC output signal having an increased magnitude.

Similar to as described previously, the Josephson AC/DC converters 154 can therefore operate to convert the in-phase AC input signal $AC_I$ and the quadrature-phase AC input signal $AC_Q$ to the DC signals $I_{DC\_1}$ through $I_{DC\_N}$ in a power efficient manner based on having a lack of resistors. Therefore, the Josephson AC/DC converters 154 only dissipate power via the current pulses to provide the respective DC signals $I_{DC\_1}$ through $I_{DC\_N}$ to the devices 152, such that no additional power is dissipated to maintain the SFQ pulse propagating around the flux-shuttle loop in each of the Josephson AC/DC converters 154. In addition, the Josephson AC/DC converters 154 can generate substantially no heat from static power dissipation, as opposed to typical resistance-based DC power sources. Accordingly, the Josephson AC/DC converters 154 can operate efficiently and effectively in the superconducting circuit system 150.

Figure 5:
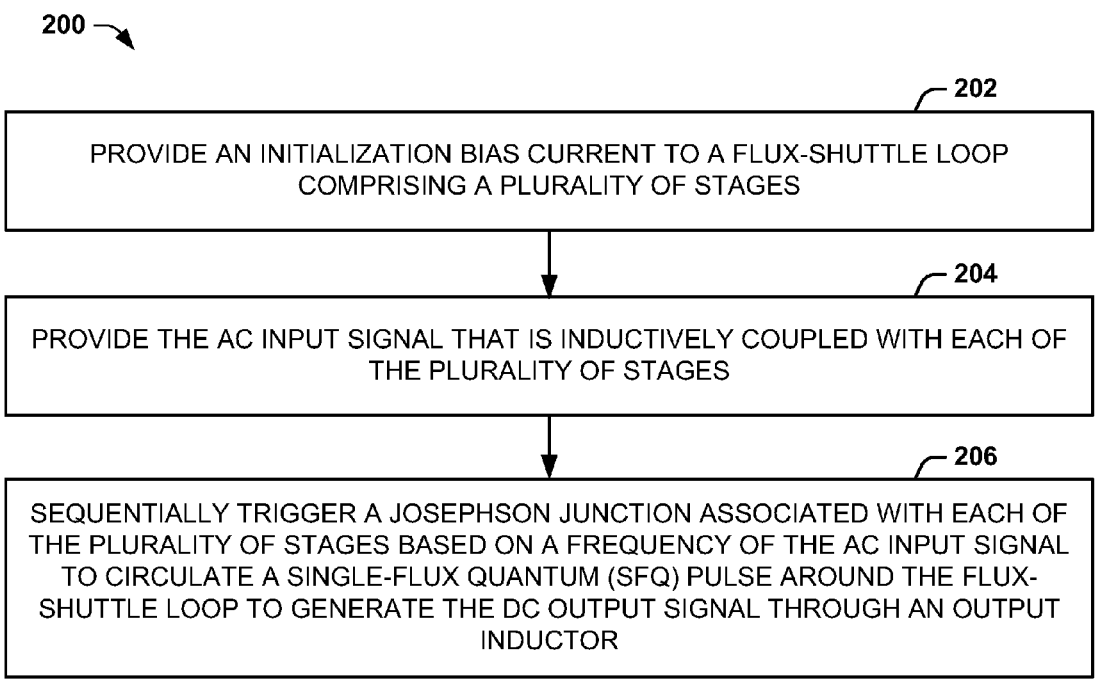
FIG. 5 illustrates an example of a method for providing a DC output signal based on an AC input signal.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 200 for providing a DC output signal (e.g., the DC output signal $I_{DC}$) based on an AC input signal (e.g., the AC input signal AC). At 202, an initialization bias current (e.g., the initialization bias current $I_{B\_IN}$) is provided to a flux-shuttle loop (e.g., the flux-shuttle loop 16) comprising a plurality of stages (e.g., the stages 54, 56, 58, and 60). At 204, the AC input signal that is inductively coupled with each of the plurality of stages is provided. At 206, a Josephson junction (e.g., the Josephson junction $J_2$) associated with each of the plurality of stages is sequentially triggered based on a frequency of the AC input signal to circulate an SFQ pulse around the flux-shuttle loop to generate the DC output signal through an output inductor (e.g., the output inductor $L_{OUT}$).

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An AC/DC converter system comprising:
   a flux-shuttle loop that is inductively coupled with an AC input signal; and
   a plurality of stages each comprising at least one Josephson junction, the plurality of stages being spaced about the flux shuttle loop and being configured to sequentially trigger the respective at least one Josephson junction in response to the AC input signal and to provide a single-flux quantum (SFQ) pulse that moves sequentially and continuously through each stage of the plurality of stages around the flux-shuttle loop via each of the at least one Josephson junction of each of the respective stages that results in a DC output signal being provided through an output inductor.

2. The system of claim 1, wherein the flux-shuttle loop further comprises a plurality of transformers configured to inductively couple the flux-shuttle loop with the AC input signal, wherein the AC input signal is provided through a primary winding of each of the plurality of transformers to induce a bias current in a secondary winding of each of the plurality of transformers.

3. The system of claim 2, wherein the primary winding of each of a first portion of the plurality of transformers have an opposite polarity relative to a primary winding of a second portion of the plurality of transformers, such that a second polarity portion of the AC input signal induces the bias current in a first direction in the secondary winding of the first portion of the plurality of transformers and a first polarity portion of the AC input signal induces a bias current in the first direction in the secondary winding of the second portion of the plurality of transformers.

4. The system of claim 1, wherein the AC input signal comprises an in-phase AC input signal and a quadrature-phase AC input signal.

5. The system of claim 4, wherein the flux-shuttle loop further comprises a plurality of transformers configured to inductively couple the flux-shuttle loop with each of the in-phase AC input signal and the quadrature-phase AC input signal, wherein the in-phase AC input signal is provided through a primary winding of a first portion of the plurality of transformers to induce a bias current in a secondary winding of the first portion of the plurality of transformers, and wherein the quadrature-phase AC input signal is provided through a primary winding of a second portion of the plurality of transformers to induce a bias current in a secondary winding of the second portion of the plurality of transformers.

6. The system of claim 5, wherein the primary winding of each of the second portion of the plurality of transformers has an opposite polarity relative to a primary winding of the first portion of the plurality of transformers, such that a second polarity portion of each of the in-phase AC input signal and the quadrature-phase AC input signal induces a bias current in a first direction in the secondary winding of the second portion of the plurality of transformers, and a first polarity portion of each of the in-phase AC input signal and the quadrature-phase AC input signal induces a bias current in the first direction in the secondary winding of the first portion of the plurality of transformers.

7. The system of claim 1, wherein the flux-shuttle loop further comprises an initialization transformer having a secondary winding configured to provide an initialization bias current in the flux-shuttle loop in response to an initialization signal that is provided through a primary winding of the initialization transformer.

8. The system of claim 7, wherein a transformer configured to inductively couple the respective one of the plurality of stages with the AC input signal, wherein a first of the plurality of stages includes the initialization transformer, such that a current pulse generated via the SFQ pulse at the first of the plurality of stages is provided to a second of the plurality of stages via the secondary winding of the initialization transformer.

9. The system of claim 1, wherein each of the plurality of stages further comprises:
   a transformer configured to generate a bias current based on inductive coupling of the AC input signal, wherein each of the at least one Josephson junction is configured to trigger to generate a current pulse in response to the bias current; and
   a storage inductor interconnecting the respective one of the plurality of stages with the output inductor and being configured to provide the current pulse to the output inductor.

10. A superconducting circuit system comprising a plurality of the AC/DC converter system of claim 1, the plurality of AC/DC converter systems being configured to generate a respective plurality of DC output signals.

11. A method for providing a DC output signal based on an AC input signal, the method comprising:
   providing an initialization bias current to a flux-shuttle loop comprising a plurality of stages;
   providing the AC input signal that is inductively coupled with each of the plurality of stages; and
   sequentially triggering at least one Josephson junction associated with each of the plurality of stages in response to the AC input signal and the initialization bias current to continuously circulate a single-flux quantum (SFQ) pulse around the flux-shuttle loop via each of the at least one Josephson junction associated with each of the plurality of stages to generate the DC output signal through an output inductor.

12. The method of claim 11, wherein providing the AC input signal comprises providing the AC input signal to a primary winding of each of a plurality of transformers that are each associated with one of the respective plurality of stages to induce a bias current in a secondary winding of each of the plurality of transformers.

13. The method of claim 12, wherein providing the AC input signal to the primary winding comprises:
   providing the AC input signal to the primary winding of each of a first portion of the plurality of transformers to induce the bias current in the secondary winding in a first direction in response to a first polarity portion of the AC input signal; and
   providing the AC input signal to the primary winding of each of a second portion of the plurality of transformers to induce the bias current in the secondary winding in the first direction in response to a second polarity portion of the AC input signal.

14. The method of claim 11, wherein providing the AC input signal comprises providing an in-phase AC input signal and a quadrature-phase AC input signal.

15. The method of claim 11, wherein providing the initialization signal comprises providing a DC initialization signal through a primary winding of the initialization transformer to induce a bias current in the flux-shuttle loop.

16. The method of claim 11, wherein providing the initialization signal comprises providing the initialization signal to a flux-shuttle loop associated with each of a plurality of AC/DC converters, wherein providing the AC input signal comprises providing the AC input signal to each of the plurality of AC/DC converters, and wherein sequentially triggering the Josephson junction associated with each of the plurality of stages comprises sequentially triggering a Josephson junction associated with each of the plurality of stages of the flux-shuttle loop associated with each of the plurality of AC/DC converters to generate a DC output signal through an output inductor associated with each of the plurality of AC/DC converters.

17. An AC/DC converter system comprising:
   a flux-shuttle loop comprising a plurality of stages and being configured to receive an AC input signal, each of the plurality of stages comprising:
      a transformer configured to generate a bias current based on inductive coupling of the AC input signal to the respective one of the plurality of stages;
      a Josephson junction configured to trigger to provide a single-flux quantum (SFQ) pulse in response to the bias current; and
      a storage inductor that is interconnected with the output inductor and configured to provide a current pulse output in response to the SFQ pulse; and
   an output inductor coupled to each of the storage inductors and being configured to provide the DC output signal based on the received current pulse outputs that are sequentially provided from each of the storage inductors.

18. The system of claim 17, wherein the transformer associated with each of the plurality of phases is configured to generate the bias current in a sequence through each of the plurality of stages based on the frequency of the AC input signal, such that the Josephson junction associated with each of the plurality of phases is configured to trigger in the sequence to provide the SFQ pulse around the flux-shuttle loop.

19. The system of claim 17, wherein the AC input signal comprises an in-phase AC input signal and a quadrature-phase AC input signal, wherein the in-phase AC input signal is provided through a primary winding of the transformer in each of a first portion of the plurality of stages to induce the bias current in a secondary winding of the transformer in each of the first portion of the plurality of stages, and wherein the quadrature-phase AC input signal is provided through a primary winding of the transformer in each of a second portion of the plurality of stages to induce the bias current in a secondary winding of the transformer in each of the second portion of the plurality of stages.

20. The system of claim 19, wherein the primary winding of the transformer in each of a first portion of the plurality of stages has an opposite polarity relative to the primary winding of the transformer in each of second portion of the plurality of stages, such that a second polarity portion of each of the in-phase AC input signal and the quadrature-phase AC input signal induces a bias current in a first direction in the secondary winding of the transformer in each of second portion of the plurality of stages, and a first polarity portion of each of the in-phase AC input signal and the quadrature-phase AC input signal induces a bias current in the first direction in the secondary winding of the transformer in each of first portion of the plurality of stages.

* * * * *